(12) United States Patent
Chang et al.

(10) Patent No.: US 8,255,781 B2
(45) Date of Patent: Aug. 28, 2012

(54) METHOD FOR GENERATING CODEWORD IN WIRELESS COMMUNICATION SYSTEM

(75) Inventors: Jae Won Chang, Anyang-si (KR); Bin Chul Ihm, Anyang-si (KR); Moon Il Lee, Anyang-si (KR); Jin Young Chun, Anyang-si (KR)

(73) Assignee: LG Electronics Inc., Seoul (KR)

( * ) Notice: Subject to any disclaimer, the term of this patent is extended or adjusted under 35 U.S.C. 154(b) by 840 days.

(21) Appl. No.: 12/440,885

(22) PCT Filed: Oct. 5, 2007

(86) PCT No.: PCT/KR2007/004874
§ 371 (c)(1),
(2), (4) Date: Mar. 11, 2009

(87) PCT Pub. No.: WO2008/044841
PCT Pub. Date: Apr. 17, 2008

(65) Prior Publication Data
US 2010/0020894 A1    Jan. 28, 2010

Related U.S. Application Data

(60) Provisional application No. 60/828,762, filed on Oct. 9, 2006.

(30) Foreign Application Priority Data

Jan. 24, 2007   (KR) .................. 10-2007-0007423

(51) Int. Cl.
*G06F 11/00*   (2006.01)

(52) U.S. Cl. ....................................................... 714/793
(58) Field of Classification Search ................. 714/752, 714/793; 341/67
See application file for complete search history.

(56) References Cited

U.S. PATENT DOCUMENTS

| 7,093,189 B2 * | 8/2006 | Lee et al. ................. 714/797 |
| 7,313,752 B2 * | 12/2007 | Kyung et al. ............. 714/801 |
| 2002/0010893 A1 * | 1/2002 | Kim et al. ................. 714/790 |

FOREIGN PATENT DOCUMENTS

WO   WO-01/56218 A1   8/2001

OTHER PUBLICATIONS

Branislav M. Popović, "New Complex Space-Time Block Codes for Efficient Transmit Diversity", Sep. 6-8, 2000, vol. 1, pp. 132-136, 2000 IEEE 6th International Symposium on Spread-Spectrum Techniques and Applications.

* cited by examiner

*Primary Examiner* — Joshua Lohn
(74) *Attorney, Agent, or Firm* — Birch, Stewart, Kolasch & Birch, LLP

(57) ABSTRACT

A method for generating a codeword that is insensitive to variations of a channel and easily extensible is provided. The method includes obtaining a primary unit by taking a row vector from an N(E(N−1) simplex code and mapping a control signal to the codeword. The simplex code is obtained by removing a first row from an N(ENorthogonal matrix. The codeword is obtained by combining a plurality of primary units.

12 Claims, 3 Drawing Sheets

[Fig. 1]
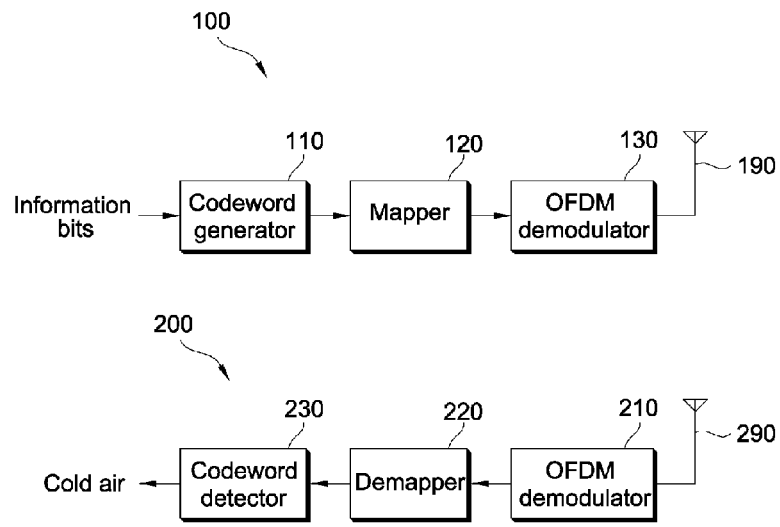
[Fig. 2]
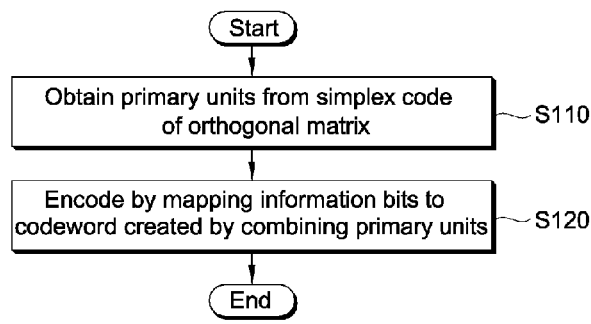
[Fig. 3]
```
L: LSB    M: MSB
L    M                              L    M
00000 = [P0 P0 P0 P0]               10000 = [P0 P1 P0 P1]
00001 = [P1 P1 P1 P1]               10001 = [P1 P0 P1 P0]
00010 = [P2 P2 P2 P2]               10010 = [P2 P3 P2 P3]
00011 = [P3 P3 P3 P3]               10011 = [P3 P2 P3 P2]
00100 = [P0 P1 P2 P3]               10100 = [P0 P0 P2 P2]
00101 = [P1 P2 P3 P0]               10101 = [P2 P2 P0 P0]
00110 = [P2 P3 P0 P1]               10110 = [P1 P1 P3 P3]
00111 = [P3 P0 P1 P2]               10111 = [P3 P3 P1 P1]
01000 = [P0 P2 P0 P2]               11000 = [P0 P1 P1 P0]
01001 = [P2 P0 P2 P0]               11001 = [P1 P0 P0 P1]
01010 = [P1 P3 P1 P3]               11010 = [P2 P3 P3 P2]
01011 = [P3 P1 P3 P1]               11011 = [P3 P2 P2 P3]
01100 = [P0 P3 P3 P0]               11100 = [P0 P2 P3 P1]
01101 = [P3 P0 P0 P3]               11101 = [P2 P0 P1 P3]
01110 = [P1 P2 P2 P1]               11110 = [P3 P1 P0 P2]
01111 = [P2 P1 P1 P2]               11111 = [P1 P3 P2 P0]
```

[Fig. 4]
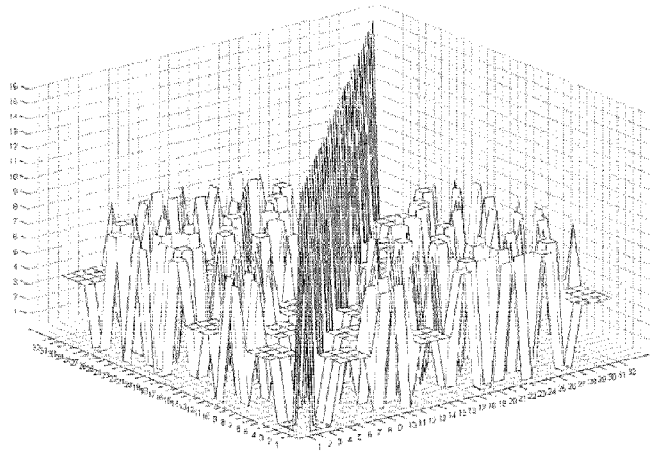
[Fig. 5]
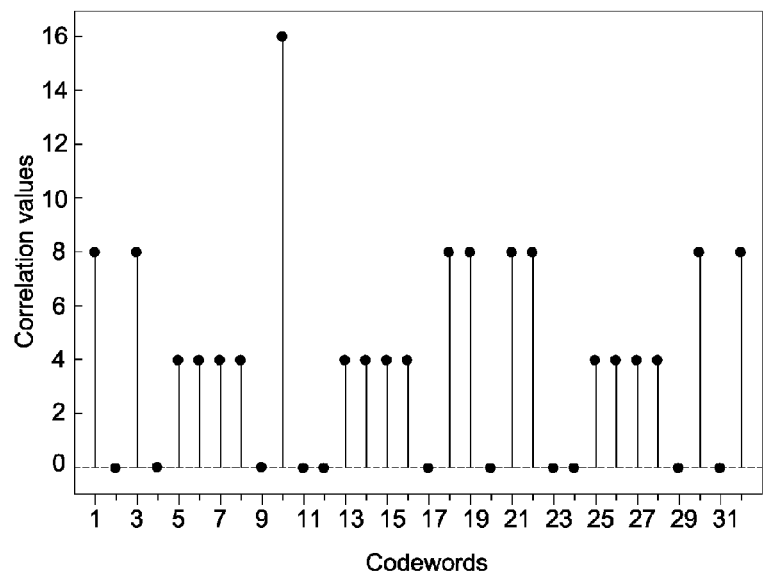
[Fig. 6]
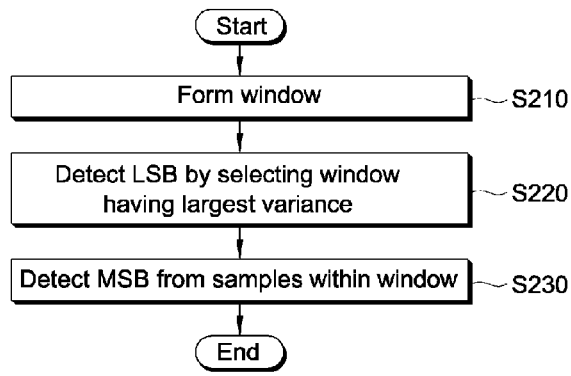

[Fig. 7]
MSB 2 bits
00 = [P0 P0]
01 = [P1 P1]
10 = [P2 P2]
11 = [P3 P3]
LSB 3 bits
000 = [P1 P3]
001 = [P2 P3]
010 = [P0 P0]
011 = [P1 P1]
100 = [P2 P2]
101 = [P3 P3]
110 = [P0 P1]
111 = [P1 P2]
[Fig. 8]
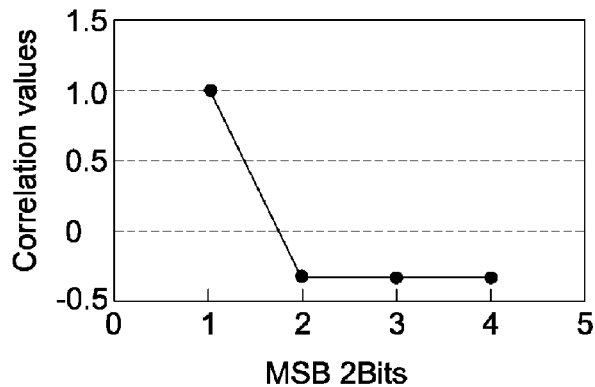
[Fig. 9]
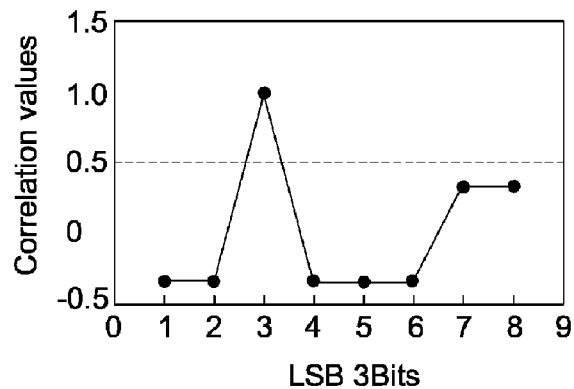

METHOD FOR GENERATING CODEWORD IN WIRELESS COMMUNICATION SYSTEM

This application is the National Phase of PCT/KR2007/004874 filed on Oct. 5, 2007, which claims priority under 35 U.S.C. 119(e) to U.S. Provisional Application No. 60/828,762 filed on Oct. 9, 2006, and under 35 U.S.C. 119(a) to Patent Application No. 10-2007-0007423 filed in the Republic of Korea on Jan. 24, 2007, respectively, all of which are hereby expressly incorporated by reference into the present application.

TECHNICAL FIELD

The present invention relates to a method for encoding information bits in a wireless communication system, and more specifically, to a method for generating a codeword that is insensitive to variations of a channel and easily extensible in a wireless communication system.

BACKGROUND ART

Next generation multimedia wireless communication system on which studies are actively undertaken recently is required to be capable of processing and transmitting a variety of information, such as image data, packet data and the like, more than providing early stage voice-oriented services.

One of the most fundamental problems to be solved to accomplish high speed communication is how efficiently and reliably data can be transmitted through a channel. In channel environment of a wireless communication system, unlike that of a wired communication system, loss of information is inevitable due to errors occurred by a variety of factors such as multi-path interferences, shadowing, electromagnetic wave attenuation, time-varying noises, interferences and fading, or the like. Such loss of information practically generates severe distortions in a transmission signal and acts as a factor that degrades overall performance of the system. It is general to enhance reliability of systems using a variety of error-control techniques depending on characteristics of a channel in order to reduce loss of information, and one of the error-control techniques is error-correcting code.

A codeword is a bit stream that is generated by performing a specific process (e.g. channel coding) on information bits comprising zeros and ones in order to enhance detection performance when the information bits are transmitted. In block channel coding such a Reed-Muller code, a codeword is generated through a matrix that is called as a generating matrix. In trellis channel coding such a convolutional code or a turbo code, a codeword is generated through a polynomial expression such as a generating polynomial.

A codeword used for channel coding should have a bit stream comprising more than a certain number of bits to guarantee its performance. Performance of detecting the codeword is depending on performance of channel estimation. If the length of the codeword is not enough long, non-coherent detection is widely used. In the non-coherent detection, the codeword is detected without performing channel estimation so that performance of channel estimation does not affect performance of detecting the codeword. On the contrary, the codeword is detected using channel estimation in the coherent detection.

In the non-coherent detection, it is necessary to use an orthogonal code that has superior characteristics of auto-correlation and cross-correlation in order to enhance detection performance of the codeword.

Various control signals are exchanged between a transmitter and a receiver in order to transfer traffic data in a wireless communication system. Control signals includes a channel quality indicator (CQI), an acknowledgement/negative-acknowledgement (ACK/NACK), a multiple input multiple output (MIMO) codebook index or the like. Since the control signals is used to determine modulation and coding scheme of the traffic data, the control signals should be successfully detected before the traffic data are transferred from the transmitter to the receiver.

In coherent detection, a control signal is detected after a channel is estimated and compensated. The control signal is converted into a codeword by performing channel coding. As the length of the codeword is the longer, the more excellent detection performance can be achieved. However, when the length of the codeword is not enough long, the detection performance can be significantly degraded. The detection performance is very sensitive to performance of channel estimation.

In non-coherent detection, a control signal is converted into a codeword by mapping to an orthogonal code. The codeword of the control signal is detected using a correlator instead a channel estimator and the codeword is demapped to the control signal. Although the length of a codeword in non-coherent detection is shorter than that of a codeword in non-coherent detection, detection performance in non-coherent detection can be relatively highly achieved. Furthermore, since the detection performance is not affected by performance of channel estimation, complexity due to the channel estimation can be greatly lowered.

The codeword that uses the orthogonal code has lack of extensibility since the length of the codeword is exponentially increases in proportion to the number of bits to be transmitted and complexity of the correlator increases as the length of the codeword increases.

In order to improve detection performance, a method for designing a codeword that is insensitive to variations of a channel, less complex and easily extensible is needed.

DISCLOSURE OF INVENTION

Technical Problem

It is an object of the invention to provide a method for generating a codeword that is insensitive to variations of a channel, less complex and easily extensible.

Technical Solution

In an aspect, there is provided a method for generating a codeword for transmitting a control signal. The method includes obtaining a primary unit by taking a row vector from an N×(N−1) simplex code and mapping a control signal to the codeword. The simplex code is obtained by removing a first row from an N×N orthogonal matrix. The codeword is obtained by combining a plurality of primary units.

In another aspect, there is provided a method for generating a codeword to improve detection performance of information bits. The method includes obtaining a primary unit by taking a row or a column of an orthogonal matrix and encoding the information bits by mapping the information bits to the codeword that is obtained by combining a plurality of primary units.

Advantageous Effects

Information bits can be efficiently transmitted with only a small amount of resources. Detection performance robust to channel estimation errors can be obtained.

BRIEF DESCRIPTION OF THE DRAWINGS

FIG. 1 is a block diagram showing a transmitter and a receiver according to an embodiment of the present invention.

FIG. 2 is a flowchart illustrating a method for generating a codeword according to an embodiment of the present invention.

FIG. 3 is a view showing an example of mapping information bits to a codeword.

FIG. 4 is a graph showing characteristics of auto-correlations and cross-correlations of the codewords shown in FIG. 3.

FIG. 5 is a graph showing a correlation value of the tenth codeword of FIG. 3.

FIG. 6 is a flowchart illustrating a method for detecting a codeword according to an embodiment of the present invention.

FIG. 7 is a view showing another example of mapping information bits to a codeword.

FIG. 8 is a graph showing correlation values of two bits on the MSB side.

FIG. 9 is a graph showing correlation values of three bits on the LSB side.

MODE FOR THE INVENTION

FIG. 1 is a block diagram showing a transmitter and a receiver according to an embodiment of the present invention.

Referring to FIG. 1, the transmitter 100 includes a codeword generator 110, a mapper 120 and an orthogonal frequency division multiplexing (OFDM) modulator 130.

The codeword generator 110 processes inputted information bits to generate a codeword. The mapper 120 maps the codeword to a symbol over signal constellation. The OFDM modulator 130 transforms the symbol to an OFDM symbol by performing inverse fast Fourier transform (IFFT). A cyclic prefix (CP) can be added to the OFDM symbol. The OFDM symbol is transmitted through a transmission antenna 190.

The receiver 200 includes an OFDM demodulator 210, a demapper 220, and a codeword detector 230. The OFDM demodulator 210 transforms a signal received through a receiving antenna 290 into a symbol by performing a fast Fourier transform (FFT). The demapper 220 demaps the symbol. The codeword detector 230 detects an original signal by using the characteristics of auto-correlation and cross-correlation of the codeword.

The transmitter 100 and the receiver 200 uses Orthogonal frequency division multiplexing (OFDM)/orthogonal frequency division multiple access (OFDMA) as multiple access scheme. method. However, the present inventive concept can be applied to other multiple access schemes, such as time division multiple access (TDMA), code division multiple access (CDMA) or the like.

In a single-input single-output (SISO) wireless communication system, a transmitter and a receiver use single transmission antenna and single receiving antenna. However, the present inventive concept can be easily applied to a multi-input multi-output (MIMO) wireless communication system having multiple transmission antennas and multiple receiving antennas.

FIG. 2 is a flowchart illustrating a method for generating a codeword according to an embodiment of the present invention.

Referring to FIG. 2, a primary unit is extracted from a simplex code of an orthogonal matrix S110. Two different row (or column) vectors of the orthogonal matrix are orthogonal to each other, i.e., the inner product of two different row (or column) vectors is zero. An inverse matrix of the orthogonal matrix is a Hermitian matrix. The simplex code is generated by removing the first column (or row) from the orthogonal matrix.

One example of the orthogonal matrix is a Fourier matrix. The Fourier matrix is an N×N matrix having entries of $w^{mn}$ shown:

MathFigure 1

$$w^{mn} = e^{-j2\pi mn/N} \qquad [\text{Math.1}]$$

where m and n respectively denote 0, 1, ..., (N−1) and N is an integer.

The Fourier matrix W can be expressed as below.

MathFigure 2

$$W = \begin{bmatrix} e^{-j2\pi \cdot 0 \cdot 0/N} & e^{-j2\pi \cdot 0 \cdot 1/N} & \cdots & e^{-j2\pi \cdot 0 \cdot (N-1)/N} \\ e^{-2\pi \cdot 1 \cdot 0/N} & e^{-j2\pi \cdot 1 \cdot 1/N} & \cdots & e^{-j2\pi \cdot 1 \cdot (N-1)/N} \\ \vdots & \vdots & & \vdots \\ e^{-2\pi \cdot (N-1) \cdot 0/N} & e^{-2\pi \cdot (N-1) \cdot 1/N} & \cdots & e^{-2\pi \cdot (N-1) \cdot (N-1)/N} \end{bmatrix} \qquad [\text{Math. 2}]$$

For example, a 2×2 Fourier matrix can be expressed as below.

MathFigure 3

$$W_2 = \begin{bmatrix} 1 & 1 \\ 1 & e^{-j2\pi/2} \end{bmatrix} = \begin{bmatrix} 1 & 1 \\ 1 & -1 \end{bmatrix} \qquad [\text{Math. 3}]$$

A 4×4 Fourier matrix can be expressed as shown below.

MathFigure 4

$$W_4 = \begin{bmatrix} 1 & 1 & 1 & 1 \\ 1 & e^{-j\pi/2} & e^{-j\pi} & e^{-j3\pi/2} \\ 1 & e^{-j\pi} & e^{-j2\pi} & e^{-j3\pi} \\ 1 & e^{-j3\pi/2} & e^{-j3\pi} & e^{-j9\pi/2} \end{bmatrix} = \begin{bmatrix} 1 & 1 & 1 & 1 \\ 1 & -j & -1 & j \\ 1 & -1 & 1 & -1 \\ 1 & j & -1 & -j \end{bmatrix} \qquad [\text{Math. 4}]$$

The Fourier matrix can be generated in a variety of ways. For example, a Fourier matrix can be created using entry $w^{mn}_r$ shown:

MathFigure 5

$$w^{mn}_r = e^{j2\pi mn/N} \qquad [\text{Math.5}]$$

where m and n respectively denote 0, 1, ..., (N−1).

A normal factor can be multiplied to transform a Fourier matrix into a unitary matrix. For example, a unitary matrix of the 2×2 Fourier matrix can be expressed as shown below.

MathFigure 6

$$W_2^{uni} = \frac{1}{\sqrt{2}}\begin{bmatrix} 1 & 1 \\ 1 & e^{-j2\pi/2} \end{bmatrix} = \frac{1}{\sqrt{2}}\begin{bmatrix} 1 & 1 \\ 1 & -1 \end{bmatrix} \quad [\text{Math. 6}]$$

For another example, a Walsh code can be used as an orthogonal matrix. A 4×4 matrix using the Walsh code is shown below.

MathFigure 7

$$W_4^{walsh} = \begin{bmatrix} 1 & 1 & 1 & 1 \\ 1 & -1 & 1 & -1 \\ 1 & 1 & -1 & -1 \\ 1 & -1 & -1 & 1 \end{bmatrix} \quad [\text{Math. 7}]$$

An orthogonal matrix is not limited to the examples described above, but can be obtained in a variety of other methods.

After obtaining the orthogonal matrix, the simplex code is generated by removing the first column (or row) from the orthogonal matrix. Hereinafter, a simplex code is a matrix created by removing the first column from an orthogonal matrix.

A simplex code S of the Fourier matrix can be expressed as shown below.

MathFigure 8

$$S = \begin{bmatrix} e^{-j2\pi \cdot 0 \cdot 1/N} & e^{-j2\pi \cdot 0 \cdot 2/N} & \ldots & e^{-j2\pi \cdot 0 \cdot (N-1)/N} \\ e^{-2\pi \cdot 1 \cdot 1/N} & e^{-j2\pi \cdot 1 \cdot 2/N} & \ldots & e^{-j2\pi \cdot 1 \cdot (N-1)/N} \\ \vdots & \vdots & & \vdots \\ e^{-2\pi \cdot (N-1) \cdot 1/N} & e^{-2\pi \cdot (N-1) \cdot 2/N} & \ldots & e^{-2\pi \cdot (N-1) \cdot (N-1)/N} \end{bmatrix} \quad [\text{Math. 8}]$$

$$\equiv \begin{bmatrix} w^0 & w^0 & \ldots & w^0 \\ w^{1 \cdot 1} & w^{1 \cdot 2} & \ldots & w^{1 \cdot (N-1)} \\ \vdots & \vdots & & \vdots \\ w^{(N-1) \cdot 1} & w^{(N-1) \cdot 2} & \ldots & w^{(N-1) \cdot (N-1)} \end{bmatrix}$$

For example, a 2×1 simplex code of the 2×2 Fourier matrix can be expressed as shown below.

MathFigure 9

$$S_2 = \begin{bmatrix} 1 \\ e^{-j2\pi/2} \end{bmatrix} = \begin{bmatrix} 1 \\ -1 \end{bmatrix} \quad [\text{Math. 9}]$$

A 4×3 simplex code of the 4×4 Fourier matrix can be expressed as shown below.

MathFigure 10

$$S_4 = \begin{bmatrix} 1 & 1 & 1 \\ e^{-j\pi/2} & e^{-j\pi} & e^{-j3\pi/2} \\ e^{-j\pi} & e^{-j2\pi} & e^{-j3\pi} \\ e^{-j3\pi/2} & e^{-j3\pi} & e^{-j9\pi/2} \end{bmatrix} = \begin{bmatrix} 1 & 1 & 1 \\ -j & -1 & j \\ -1 & 1 & -1 \\ j & -1 & -j \end{bmatrix} \quad [\text{Math. 10}]$$

The primary unit can be obtained by taking each row vector of the simplex code. The primary unit can be obtained by removing at least one element from a row of an orthogonal matrix.

The primary unit is $P_i$ can be expressed as shown below.

MathFigure 11

$$\begin{bmatrix} P_0 \\ P_1 \\ \vdots \\ P_{n-1} \end{bmatrix} = \begin{bmatrix} w^0 & w^0 & \ldots & w^0 \\ w^{1 \cdot 1} & w^{1 \cdot 2} & \ldots & w^{1 \cdot (N-1)} \\ \vdots & \vdots & & \vdots \\ w^{(N-1) \cdot 1} & w^{(N-1) \cdot 2} & \ldots & w^{(N-1) \cdot (N-1)} \end{bmatrix} \quad [\text{Math. 11}]$$

The length of the primary unit is N−1, i.e., N−1 symbols are contained in the primary unit. N primary units can be obtained for N×(N−1) simple code.

Although a primary unit is obtained by taking a row vector of a simplex code as described above, the primary unit can be obtained by taking a column vector of the simplex code. When the primary unit is obtained by taking a column vector, the simplex code can be obtained by removing the first row of an orthogonal matrix.

Information bits are encoded by mapping the information bits to a codeword created by combining primary units obtained as described above S120. The information bits can contain control information or traffic data. The information bits containing the control information become a control signal.

The codeword is created by combining the primary units, and the length or number of the codeword can be extended through various combinations of the primary units.

In an embodiment, a codeword C can be generated by repeating the same primary unit as shown below.

MathFigure 12

$$C = [P_i P_i P_i \ldots P_i], \, i = 0, \ldots, N-1 \quad [\text{Math.12}]$$

When the codeword consists of K primary units, N codewords having a length of (N−1)×K can be generated.

In another embodiment, a codeword can be generated by repeating the same primary unit twice as shown below.

MathFigure 13

$$C^0 = [P_0 P_0 P_i P_i P_0 P_0 P_i P_i \ldots ], \quad i = 0, \ldots, N-1, i \neq 0 \quad [\text{Math. 13}]$$
$$C^1 = [P_1 P_1 P_i P_i P_1 P_1 P_i P_i \ldots ], \quad i = 0, \ldots, N-1, i \neq 1$$
$$\vdots$$
$$C^{N-1} = [P_{N-1} P_{N-1} P_i P_i P_{N-1} P_{N-1} \ldots ], \quad i = 0, \ldots, N-1, i \neq N-1$$

When the codeword consists of K primary units, N(N−1) codewords having a length of (N−1)×K can be generated.

In still another embodiment, a codeword can be generated by arranging two different primary units as shown below.

MathFigure 14

$$C^0 = [P_0 P_i P_0 P_i P_0 P_i \ldots ], \quad i = 0, \ldots, N-1, i \neq 0 \quad [\text{Math. 14}]$$
$$C^1 = [P_1 P_i P_1 P_i P_1 P_i \ldots ], \quad i = 0, \ldots, N-1, i \neq 1$$
$$\vdots$$
$$C^{N-1} = [P_{N-1} P_i P_{N-1} P_i \ldots ], \quad i = 0, \ldots, N-1, i \neq N-1$$

When the codeword consists of K primary units, N(N−1) codewords having a length of (N−1)×K can be generated.

In still another embodiment, a codeword can be generated by repeating a primary unit and two other primary units as shown below.

MathFigure 15

$$C^0 = [P_0 P_i P_i P_0 P_i P_i \ldots], \quad i = 0, \ldots, N-1, i \neq 0$$
$$C^1 = [P_1 P_i P_i P_1 P_i P_i \ldots], \quad i = 0, \ldots, N-1, i \neq 1$$
$$\vdots$$
$$C^{N-1} = [P_{N-1} P_i P_i P_{N-1} \ldots], \quad i = 0, \ldots, N-1, i \neq N-1$$

[Math. 15]

When the codeword consists of K primary units, N(N−1) codewords having a length of (N−1)×K can be generated.

In still another embodiment, a codeword can be generated by sequentially increasing or decreasing the index of a primary unit as shown below.

MathFigure 16

$$C^0 = [P_{(0+i) \bmod N} P_{(1+i) \bmod N} P_{(2+i) \bmod N} \ldots P_{(N-1+i) \bmod N}], i = 0, \ldots, N-1$$
$$C^1 = [P_{(0+i) \bmod N} P_{(2+i) \bmod N} P_{(1+i) \bmod N} \ldots P_{(N-1+i) \bmod N}], i = 0, \ldots, N-1$$
$$C^2 = [P_{(0+i) \bmod N} P_{(2+i) \bmod N} P_{(3+i) \bmod N} \ldots P_{(N-1+i) \bmod N}], i = 0, \ldots, N-1$$
$$C^3 = [P_{(0+i) \bmod N} P_{(2+i) \bmod N} P_{(4+i) \bmod N} \ldots P_{(N-1+i) \bmod N}], i = 0, \ldots, N-1$$
$$\vdots$$
$$C^r = [P_{(0+i) \bmod N} P_{(N-1+i) \bmod N} P_{(N-2+i) \bmod N} \ldots P_{(1+i) \bmod N}], i = 0, \ldots, N-1$$

[Math. 16]

When the codeword consists of K primary units, N(N−1)! codewords having a length of (N−1)×K can be generated.

In still another embodiment, a codeword can be generated by rotating the phase of a combination of primary units as shown:

MathFigure 17

$$C^{rot} = e^{b\theta} C^r$$

[Math.17]

where $C^r$ denotes any combination of primary units as shown in above embodiments, θ denotes phase rotation value and b denotes a certain integer larger than one. When the length of the primary unit is N (i.e., the primary unit comprises N symbols), b can have a value such that b=1, 2, ..., N−1. θ and/or b can be a value that is previously known to a transmitter and a receiver, or the transmitter can assign the value and inform the receiver of the assigned value.

The present inventive concept is not limited to the embodiments described above, but the number or length of a codeword can be expanded by combining primary units in a variety of ways. For example, various combination method for generating the codeword can be intermixed with one another.

A method previously known to both the transmitter and the receiver can be used to generate a codeword by combining primary units. Or the transmitter can determine a combination method and inform the receiver of the combination method.

FIG. 3 is a view showing an example of mapping information bits to a codeword.

Referring to FIG. 3, a codeword for information bits having 5 bits is generated by combining four primary units. The mapping between the information bits and the codeword is not limited to the examples shown in the figure, but a variety of other combination methods can be used depending on the number or length of the codeword to be needed.

The primary unit is obtained from a 3×4 simplex code shown below.

MathFigure 18

$$\begin{bmatrix} P_0 \\ P_1 \\ P_2 \\ P_3 \end{bmatrix} = \begin{bmatrix} 1 & 1 & 1 \\ e^{-j\pi/2} & e^{-j\pi} & e^{-j3\pi/2} \\ e^{-j\pi} & e^{-j2\pi} & e^{-j3\pi} \\ e^{-j3\pi/2} & e^{-j3\pi} & e^{-j9\pi/2} \end{bmatrix} = \begin{bmatrix} 1 & 1 & 1 \\ -j & -1 & j \\ -1 & 1 & -1 \\ j & -1 & -j \end{bmatrix}$$

[Math. 18]

A primary unit consists of three symbols. The information bits are mapped to the codeword including four primary units and thus the information bits are mapped to the codeword including twelve symbols.

Hereinafter, a method for detecting information bits from a codeword configured as described above will be described. To clarify the detection method, the codewords shown in FIG. 3 are used.

FIG. 4 is a graph showing characteristics of auto-correlations and cross-correlations of codewords shown in FIG. 3. Although the codewords do not have complete cross-correlation characteristics due to the characteristics of a simplex code, it can achieve appropriate cross-correlation characteristics by appropriate combination of primary units.

FIG. 5 is a graph showing correlation values of the tenth codeword of FIG. 3.

Referring to FIG. 5, the tenth codeword is mapped as [P2 P0 P2 P0] for information bits '01001'. Calculating correlation values of the first to the thirty second codeword, the value of the auto-correlation is the largest.

FIG. 6 is a flowchart illustrating a method for detecting a codeword according to an embodiment of the present invention. In order clearly described the detection method, a method for detecting the tenth codeword using the correlation values shown in FIG. 5 is described.

First, a window is formed for each of samples 1~4, 5~8, 9~12, 13~16, 17~20, 21~24, 25~28, and 29~32 S210. Eight windows can be defined in total. The number of windows or the number of samples contained within each of the windows can be changed depending on the length of a codeword.

A variance is calculated for each of the windows. Then, a window having the largest variance is selected, and the least significant bit (LSB) is detected S220. If the LSB is obtained by mapping the information bits to the eight windows, three bits starting from the LSB can be determined.

The variance is defined as shown:
MathFigure 19

$$\mathrm{Var}(i) = \frac{1}{4} \sum_{k=4\times(i-1)+1}^{4\times i} (C(k) - \overline{C}(k))^2 \quad \text{[Math. 19]}$$

where i denotes the index of a window, e.g., if there are eight windows, it becomes that i=1.2, . . . , 8. C(k) denotes a correlation value for the k-th sample, and $\overline{C}(k)$ denotes an average of all the samples, e.g.

$\overline{C}(k)=4$ for the example shown in FIG. 5.

The variance of each of the windows is obtained from the example shown in FIG. 5 is Var(3)=48, Var(1)=Var(5)=Var (6)=Var(8)=16 and Var(2)=Var(4)=Var(7) 0. Therefore, since the value of the variance Var(3) of window 3 is the largest, three bits '010' containing the first LSB can be detected in accordance with a mapping shown in Table 1. 'X' in Table 1 denotes a bit that is not detected yet.

TABLE 1

| LSB MSB | |
|---|---|
| 000 XX | Window 1 |
| 001 XX | Window 2 |
| 010 XX | Window 3 |
| 011 XX | Window 4 |
| 100 XX | Window 5 |
| 101 XX | Window 6 |
| 110 XX | Window 7 |
| 111 XX | Window 8 |

Next, the other bits on the most significant bit (MSB) side are determined by comparing correlation values of the samples within a window having the largest variance S230. The other bits and the MSB are determined by comparing variance values C(k). Here, the other bits are determined by comparing correlation values of internal sample 9, 10, 11, and 12 of window 3. Since the correlation value of the second sample among the internal samples of window 3 is the largest, '01' is detected. Accordingly, the final information bits become '01001'.

When a codeword is constructed in the method described above, information bits can be efficiently transmitted with a small amount of resources. Detection performance can be robust to channel estimation errors.

FIG. 7 is a view showing another example of mapping information bits to a codeword.

Referring to FIG. 7, information bits can be separately encoded depending on the significance of the bits configuring the information bits. The information bits can be divided into a plurality of segments and each of the plurality of segments can be separately encoded.

It is assumed that information bits having 5 bits are mapped to a codeword generated by combining four primary units. Since information on the MSB is generally more important, it is necessary to encoding the bits on the MSB side robuster than the bits on the LSB side. To accomplish unequal protection, each of the MSB and the LSB side can be separately encoded. For example, two bits on the MSB side among the five bits of the information bits are encoded by combining two primary units and three bits on the LSB side are encoded by combining two primary units. Although the total length of the codeword is the same as that of a codeword having four primary units which is generated by mapping the entire five bits, the length of the codeword on the MSB side is longer than that of the codeword on the LSB side. Thus reliability on the MSB side can be further enhanced.

Since the MSB further affects performance of a system compared with the LSB, it is necessary to improve reliability of the MSB. Therefore, bits on the MSB side is encoded by high code rate and bits on the LSB side is encoded by low code rate in order to accomplish unequal protection.

Although the information bits are divided into two segments of the MSB and the LSB sides, the information bits can be divided into three or more segments.

FIG. 8 is a graph showing correlation values of two bits on the MSB side, and FIG. 9 is a graph showing correlation values of three bits on the LSB side. A codeword is generated as shown in FIG. 7. FIG. 8 shows correlation values of the first codeword 00=[$P_0 P_0$] of two bits on the MSB side, and FIG. 9 shows correlation values of the third codeword 010=[$P_0 P_0$] of three bits on the LSB side.

Referring to FIGS. 8 and 9, the auto-correlation value of the first codeword of two bits on the MSB side is the same as that of the third codeword of three bits on the LSB side. However, codewords of the two bits on the MSB side uniformly have a low cross-correlation value. A certain codeword among codewords of the three bits on the LSB side has a cross-correlation value relatively larger than that of the other codewords. Therefore, performance of a codeword on the MSB side is superior.

The steps of a method described in connection with the embodiments disclosed herein may be implemented by hardware, software or a combination thereof. The hardware may be implemented by an application specific integrated circuit (ASIC) that is designed to perform the above function, a digital signal processing (DSP), a programmable logic device (PLD), a field programmable gate array (FPGA), a processor, a controller, a microprocessor, the other electronic unit, or a combination thereof. A module for performing the above function may implement the software. The software may be stored in a memory unit and executed by a processor. The memory unit or the processor may employ a variety of means that is well known to those skilled in the art.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims. Therefore, all changes and modifications that fall within the metes and bounds of the claims, or equivalence of such metes and bounds are intended to be embraced by the appended claims.

The invention claimed is:

1. A method for transmitting a control signal, the method comprising:
   determining, by a transmitter, a primary unit by taking a row vector from an N×(N−1) simplex code S, wherein the simplex code S is obtained by removing a first row from an N×N orthogonal matrix;
   mapping, by the transmitter, the control signal to the codeword, wherein the codeword is obtained by combining a plurality of primary units; and
   transmitting, by the transmitter, the codeword to a receiver.

2. The method of claim 1, wherein the simplex code S is $$S = \begin{bmatrix} e^{-j2\pi \cdot 0 \cdot 1/N} & e^{-j2\pi \cdot 0 \cdot 2/N} & \ldots & e^{-j2\pi \cdot 0 \cdot (N-1)/N} \\ e^{-2\pi \cdot 1 \cdot 1/N} & e^{-j2\pi \cdot 1 \cdot 2/N} & \ldots & e^{-j2\pi \cdot 1 \cdot (N-1)/N} \\ \vdots & \vdots & & \vdots \\ e^{-2\pi \cdot (N-1) \cdot 1/N} & e^{-2\pi \cdot (N-1) \cdot 2/N} & \ldots & e^{-2\pi \cdot (N-1) \cdot (N-1)/N} \end{bmatrix}.$$

3. The method of claim 1, further comprising:
rotating a phase of the combination of the plurality of primary units.

4. The method of claim 1, wherein a number of primary units to encode bits on a most significant bit (MSB) side of the control signal is different from a number of primary units to encode bits on a least significant bit (LSB) side of the control signal.

5. The method of claim 4, wherein a number of primary units to encode bits on the MSB side of the control signal is larger than a number of primary units to encode bits on the LSB side of the control signal.

6. The method of claim 1, wherein the control signal is divided into a plurality of segments and each of the plurality of segments is separately encoded.

7. A transmitter comprising:
a codeword generator configured to:
determine a primary unit by taking a row vector from an N×(N−1) simplex code S, wherein the simplex code S is obtained by removing a first row from an N×N orthogonal matrix; and
map the control signal to the codeword, wherein the codeword is obtained by combining a plurality of primary units; and
a modulator configured to transmit the codeword.

8. The transmitter of claim 7, wherein the simplex code S is $$S = \begin{bmatrix} e^{-j2\pi \cdot 0 \cdot 1/N} & e^{-j2\pi \cdot 0 \cdot 2/N} & \ldots & e^{-j2\pi \cdot 0 \cdot (N-1)/N} \\ e^{-2\pi \cdot 1 \cdot 1/N} & e^{-j2\pi \cdot 1 \cdot 2/N} & \ldots & e^{-j2\pi \cdot 1 \cdot (N-1)/N} \\ \vdots & \vdots & & \vdots \\ e^{-2\pi \cdot (N-1) \cdot 1/N} & e^{-2\pi \cdot (N-1) \cdot 2/N} & \ldots & e^{-2\pi \cdot (N-1) \cdot (N-1)/N} \end{bmatrix}.$$

9. The transmitter of claim 7, wherein the codeword generator is configured to rotate a phase of the combination of the plurality of primary units.

10. The transmitter of claim 7, wherein a number of primary units to encode bits on a most significant bit (MSB) side of the control signal is different from a number of primary units to encode bits on a least significant bit (LSB) side of the control signal.

11. The transmitter of claim 10, wherein a number of primary units to encode bits on the MSB side of the control signal is larger than a number of primary units to encode bits on the LSB side of the control signal.

12. The transmitter of claim 7, wherein the control signal is divided into a plurality of segments and each of the plurality of segments is separately encoded.

* * * * *